(12) United States Patent
Mori et al.

(10) Patent No.: US 7,368,408 B2
(45) Date of Patent: *May 6, 2008

(54) GLASS-CERAMIC COMPOSITION, GLASS-CERAMIC SINTERED BODY, AND MONOLITHIC CERAMIC ELECTRONIC COMPONENT

(75) Inventors: Naoya Mori, Omihachiman (JP); Yoichi Moriya, Omihachiman (JP); Jun Urakawa, Omihachiman (JP); Yasutaka Sugimoto, Kyoto (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/507,501

(22) Filed: Aug. 22, 2006

(65) Prior Publication Data

US 2006/0287184 A1 Dec. 21, 2006

Related U.S. Application Data

(63) Continuation-in-part of application No. PCT/JP2005/001463, filed on Feb. 2, 2005.

(30) Foreign Application Priority Data

| Mar. 1, 2004 | (JP) | ............................ 2004-055884 |
| May 6, 2004 | (JP) | ............................ 2004-137388 |
| Dec. 21, 2005 | (JP) | ............................ 2005-367843 |

(51) Int. Cl.
- C04B 35/46 (2006.01)
- C04B 35/465 (2006.01)
- C04B 35/47 (2006.01)
- C03C 14/00 (2006.01)
- C03C 10/04 (2006.01)

(52) U.S. Cl. .......................... 501/134; 501/136; 501/5; 501/32; 501/122; 428/210; 428/701; 428/702

(58) Field of Classification Search .................... 501/5, 501/32, 122, 134, 135, 136, 137, 138, 139; 428/210, 432, 701, 702

See application file for complete search history.

(56) References Cited

U.S. PATENT DOCUMENTS

| 6,385,035 B1 | 5/2002 | Matoba et al. |
| 6,448,195 B2* | 9/2002 | Kishida et al. ............... 501/32 |
| 6,458,734 B1 | 10/2002 | Sugimoto et al. |
| 6,946,415 B2* | 9/2005 | Chikagawa et al. ........... 501/32 |
| 2006/0287184 A1* | 12/2006 | Mori et al. .................... 501/32 |
| 2006/0293168 A1* | 12/2006 | Mori et al. .................. 501/136 |
| 2007/0128450 A1* | 6/2007 | Mori et al. .................. 428/432 |

FOREIGN PATENT DOCUMENTS

| JP | 06-191887 | 7/1994 |
| JP | 06-206736 | 7/1994 |
| JP | 10-106880 | 4/1998 |
| JP | 11-228222 | 8/1999 |
| JP | 11-302034 | 11/1999 |
| JP | 11-310455 | 11/1999 |
| JP | 2000-143332 | 5/2000 |
| JP | 2000-185978 | 7/2000 |
| JP | 2000-344571 | 12/2000 |
| JP | 2001-80959 A | 3/2001 |
| JP | 2002-016165 | 1/2002 |
| JP | 2002-097072 A | 4/2002 |
| JP | 2002-104870 A | 4/2002 |
| JP | 2002-128564 | 5/2002 |
| JP | 2002-265266 | 9/2002 |
| JP | 2003-002682 | 1/2003 |
| JP | 2003-002686 | 1/2003 |
| JP | 2003-026471 | 1/2003 |
| JP | 2003-119076 | 4/2003 |
| JP | 2003-342064 | 12/2003 |
| JP | 3550270 | 4/2004 |

OTHER PUBLICATIONS

International Search Report dated May 31, 2005.

* cited by examiner

Primary Examiner—Karl E Group
(74) Attorney, Agent, or Firm—Dickstein Shapiro LLP

(57) ABSTRACT

A glass-ceramic composition contains first ceramic particles principally containing forsterite; second ceramic particles principally containing at least one selected from the group consisting of calcium titanate, strontium titanate, and titanium oxide; and borosilicate glass particles containing about 3% to 15% lithium oxide, about 20% to 50% magnesium oxide, about 15% to 30% boron oxide, about 10% to 45% silicon oxide, about 6% to 20% zinc oxide, 0% to about 15% aluminum oxide, and at least one additive selected from the group consisting of calcium oxide, barium oxide, and strontium oxide on a weight basis. The content of the borosilicate glass particles is about 3% or more; the lower limit of the content of the additive is about 2%; and the upper limit of the additive content is about 15%, about 25%, or about 25% when the additive is calcium oxide, barium oxide, or strontium oxide, respectively, on a weight basis.

19 Claims, 5 Drawing Sheets

GLASS-CERAMIC COMPOSITION, GLASS-CERAMIC SINTERED BODY, AND MONOLITHIC CERAMIC ELECTRONIC COMPONENT

This is a continuation-in-part of application Serial No. PCT/JP05/001463, deposited on Feb. 2, 2005.

BACKGROUND OF THE INVENTION

1. Field of the Invention

The present invention relates to a glass-ceramic composition containing a glass component sinterable at low temperature, a glass-ceramic sintered body prepared by firing the glass-ceramic composition, and a monolithic ceramic electronic component including the glass-ceramic sintered body.

2. Description of the Related Art

In recent years, multifunctional electronic components have been used in order to manufacture compact electronic devices. Examples of such multifunctional electronic components include multilayer ceramic modules.

The multilayer ceramic modules each include a multilayer ceramic substrate. The multilayer ceramic substrate includes wiring conductors, arranged therein, for electrical connection and/or for forming passive elements such as capacitors and inductors. The multilayer ceramic substrate has various electronic components mounted thereon.

The multilayer ceramic modules are small-sized and multifunctional. Hence, the multilayer ceramic modules are useful in manufacturing compact electronic devices.

There are increasing demands for compact electronic devices operating at high frequencies. Therefore, multilayer ceramic modules operating at high frequencies need to include a multilayer ceramic substrate with good high-frequency properties. In particular, insulating ceramic sintered bodies for forming insulating ceramic layers included in this multilayer ceramic module need to have good high-frequency properties.

An insulating ceramic composition for forming the insulating ceramic sintered bodies meeting such requirements is disclosed in Japanese Unexamined Patent Application Publication No. 2000-344571 (hereinafter referred to as Patent Document 1). The insulating ceramic composition disclosed in Patent Document 1 contains three components: forsterite, calcium titanate, and spinel. The insulating ceramic composition has a Qf value of about 38,000 GHz or more and a temperature coefficient of dielectric constant of about −80 to 40 ppm/° C. when the ratio of the components is within a preferable range. The Qf value is determined by dividing the frequency (GHz) by the dielectric loss (tan σ).

The procedure for preparing those multilayer ceramic substrates included in that multilayer ceramic module includes a firing step. During firing step, the wiring conductors arranged in that multilayer ceramic module are also fired.

In order to allow that multilayer ceramic module to operate at high frequencies with no problems, the wiring conductors need to have low electrical resistance. Therefore, the wiring conductors need to be made of a metal, such as copper or silver, which has a low electrical resistance.

However, such a metal has a low melting point. Hence, in order to prepare the multilayer ceramic substrate by firing an insulating ceramic composition for forming the multilayer ceramic substrate together with the wiring conductors, the insulating ceramic composition needs to be sintered at low temperature, for example, about 1,000° C. or less.

Patent Document 1 discloses that the temperature of firing that insulating ceramic composition is about 1,140° C. to 1,600° C. Hence, that insulating ceramic composition cannot be sintered at about 1,000° C. or less.

In order to use that multilayer ceramic substrate for high-frequency applications and in order to densely arrange the wiring conductors, the insulating ceramic layers need to have a low dielectric constant. Patent Document 1 does not disclose the dielectric constant of an insulating ceramic sintered body prepared by sintering that insulating ceramic composition.

PCT Publication No. WO 2005/082806 (hereinafter referred to as Patent Document 2) discloses a glass-ceramic composition that can be sintered at about 1,000° C. or less. The glass-ceramic composition is useful in manufacturing a sintered body having a low dielectric constant and good high-frequency properties. The temperature coefficient of resonant frequency of the sintered body can be controlled so as to be small and the Qf value thereof can be controlled so as to be large.

In particular, the glass-ceramic composition disclosed in Patent Document 2 contains first ceramic particles principally containing forsterite; second ceramic particles principally containing at least one selected from the group consisting of calcium titanate, strontium titanate, and titanium oxide; and particles made of borosilicate glass. The borosilicate glass contains about 3% to 15% lithium in the form of $Li_2O$, about 30% to 50% magnesium in the form of MgO, about 15% to 30% boron in the form of $B_2O_3$, about 10% to 35% silicon in the form of $SiO_2$, about 6% to 20% zinc in the form of ZnO, and about 0% to 15% aluminum in the form of $Al_2O_3$ on a weight basis.

In recent monolithic ceramic electronic components, the ceramic layers for forming elements included in the components need to have a small thickness although the components are increasingly being used to process high-voltage signals. Therefore, a material for forming the ceramic layers needs to have higher electrical insulation reliability.

SUMMARY OF THE INVENTION

Accordingly, it is an object of the present invention to provide a glass-ceramic composition having electrical insulation reliability better than those of that glass-ceramic composition disclosed in Patent Document 1.

It is another object of the present invention to provide a glass-ceramic sintered body prepared by sintering the glass-ceramic composition, and a monolithic ceramic electronic component including the glass-ceramic sintered body.

A glass-ceramic composition according to an embodiment of the present invention contains first ceramic particles principally containing forsterite; second ceramic particles principally containing at least one selected from the group consisting of calcium titanate, strontium titanate, and titanium oxide; and borosilicate glass particles containing about 3% to 15% lithium oxide, about 20% to 50% magnesium oxide, about 15% to 30% boron oxide, about 10% to 45% silicon oxide, about 6% to 20% zinc oxide, 0% to about 15% aluminum oxide, and at least one additive selected from the group consisting of calcium oxide, barium oxide, and strontium oxide on a weight basis. The content of the borosilicate glass particles is about 3% or more; the lower limit of the content of the additive is about 2%; and the upper limit of the additive content is about 15%, about 25%, or about 25% when the additive is calcium oxide, barium oxide, or strontium oxide, respectively, on a weight basis.

In the glass-ceramic composition, it is preferable that the content of the first ceramic particles be about 55% or more, that of the second ceramic particles be about 6% to 30%, and that of the borosilicate glass particles be about 3% to 20% on a weight basis.

In the glass-ceramic composition, it is preferable that the content of calcium titanate in the glass-ceramic composition be about 18% or less when the second ceramic particles principally contain calcium titanate, the content of strontium titanate in the glass-ceramic composition be about 13% or less when the second ceramic particles principally contain strontium titanate, and the content of titanium oxide in the glass-ceramic composition be about 0.3% to 30% when the second ceramic particles principally contain titanium oxide, on a weight basis.

In the glass-ceramic composition, it is preferable that when the second ceramic particles principally contain calcium titanate and titanium oxide, with the content of calcium titanate in the glass-ceramic composition be about 8% to 12% and the content of titanium oxide in the glass-ceramic composition be about 0.3% to 3% on a weight basis.

In the glass-ceramic composition, it is preferable that when the second ceramic particles principally contain strontium titanate and titanium oxide, the content of strontium titanate in the glass-ceramic composition be about 6% to 10% and the content of titanium oxide in the glass-ceramic composition be about 0.3% to 3% on a weight basis.

A glass-ceramic sintered body, according to an embodiment of the present invention, prepared by firing a green body made of a glass-ceramic composition contains $Mg_2SiO_4$ grains which are the principal crystal grains and $Li_2(Mg, Zn)SiO_4$ grains which are the minor crystal grains. The glass-ceramic composition contains first ceramic particles principally containing forsterite; second ceramic particles principally containing at least one selected from the group consisting of calcium titanate, strontium titanate, and titanium oxide; and borosilicate glass particles containing about 3% to 15% lithium oxide, about 20% to 50% magnesium oxide, about 15% to 30% boron oxide, about 10% to 45% silicon oxide, about 6% to 20% zinc oxide, 0% to about 15% aluminum oxide, and at least one additive selected from the group consisting of calcium oxide, barium oxide, and strontium oxide on a weight basis. The content of the borosilicate glass particles is about 3% by weight or more. The lower limit of the content of the additive is about 2% by weight. The upper limit of the additive content is about 15%, about 25%, or about 25% by weight when the additive is calcium oxide, barium oxide, or strontium oxide, respectively, on a weight basis.

A monolithic ceramic electronic component according to an embodiment of the present invention includes a plurality of stacked glass-ceramic layers and wiring conductors disposed on or in the glass-ceramic layers. The glass-ceramic layers are made of the above glass-ceramic composition and the wiring conductors principally contain copper or silver.

The glass-ceramic composition can be sintered at 1,000° C. or less. The glass-ceramic sintered body prepared by firing the glass-ceramic composition is chemically stable and has a relatively low dielectric constant, a high Qf value, and a small change in temperature coefficient of resonant frequency.

When the monolithic ceramic electronic component includes the glass-ceramic sintered body, copper or silver can be used to form the wiring conductors included in the monolithic ceramic electronic component. Therefore, the monolithic ceramic electronic component is suitable for high-frequency applications.

Since the borosilicate glass particles contained in the glass-ceramic composition contain at least one additive selected from the group consisting of calcium oxide, barium oxide, and strontium oxide, the glass-ceramic sintered body prepared by firing the glass-ceramic composition has high insulation reliability. The reason for the high insulation reliability of the glass-ceramic sintered body is not clear but is probably the reason below.

The glass-ceramic sintered body contains the $Mg_2SiO_4$ grains originating from the first ceramic particles and Mg—Si—B—Zn—Li glass grains. Present in the Mg—Si—B—Zn—Li glass grains are $Li_2(Mg, Zn)SiO_4$ grains. When the second ceramic particles contain $TiO_2$, the glass-ceramic sintered body further contains $MgTiO_3$ grains and/or $MgTi_2O_5$ grains. The $MgTi_2O_5$ grains, which are crystal grains with an $AB_2O_5$ formula, probably cause a decrease in insulation reliability. When the borosilicate glass particles contain at least one of calcium oxide, barium oxide, and strontium oxide, at least one of them reacts with $TiO_2$ to produce $CaTiO_3$, $BaTiO_3$, or $SrTiO_3$, which are crystal grains with an $ABO_3$ formula. This prevents the formation of such crystal grains with an $AB_2O_5$ formula. That is, $CaTiO_3$ grains, $BaTiO_3$ grains, or $SrTiO_3$ grains are formed prior to the formation of the $MgTi_2O_5$ grains. This prevents the decrease in insulation reliability.

Therefore, the glass-ceramic layers included in the monolithic ceramic electronic component are allowed to have a small thickness.

In the glass-ceramic composition, the content of the borosilicate glass particles is small, about 20% by weight or less. Since the borosilicate glass particles are expensive, the reduction of the content of the borosilicate glass particles is advantageous in reducing manufacturing cost. Furthermore, the reduction of the content of the borosilicate glass particles allows the reaction of the borosilicate glass particles with the second ceramic particles to be readily controlled; hence, the temperature coefficient of the resonant frequency of the glass-ceramic sintered body can be readily controlled using the additive. The reduction of the content of the borosilicate glass particles leads to an increase in the plating resistance of the glass-ceramic sintered body and an increase in the production of the monolithic ceramic electronic component.

When the glass-ceramic composition contains about 8% to 12% calcium titanate and about 0.3% to 3% titanium oxide on a weight basis, a glass-ceramic sintered body prepared by firing the glass-ceramic composition is allowed to have a temperature coefficient of resonant frequency of −10 to 10 ppm/° C.

When the glass-ceramic composition contains about 6% to 10% strontium titanate and about 0.3% to 3% titanium oxide on a weight basis, a glass-ceramic sintered body prepared by firing the glass-ceramic composition is allowed to have a temperature coefficient of resonant frequency of −10 to 10 ppm/° C.

Other features, elements, characteristics and advantages of the present invention will become more apparent from the following detailed description of preferred embodiments of the present invention with reference to the attached drawings.

DESCRIPTION OF THE PREFERRED EMBODIMENTS

Figure 1:
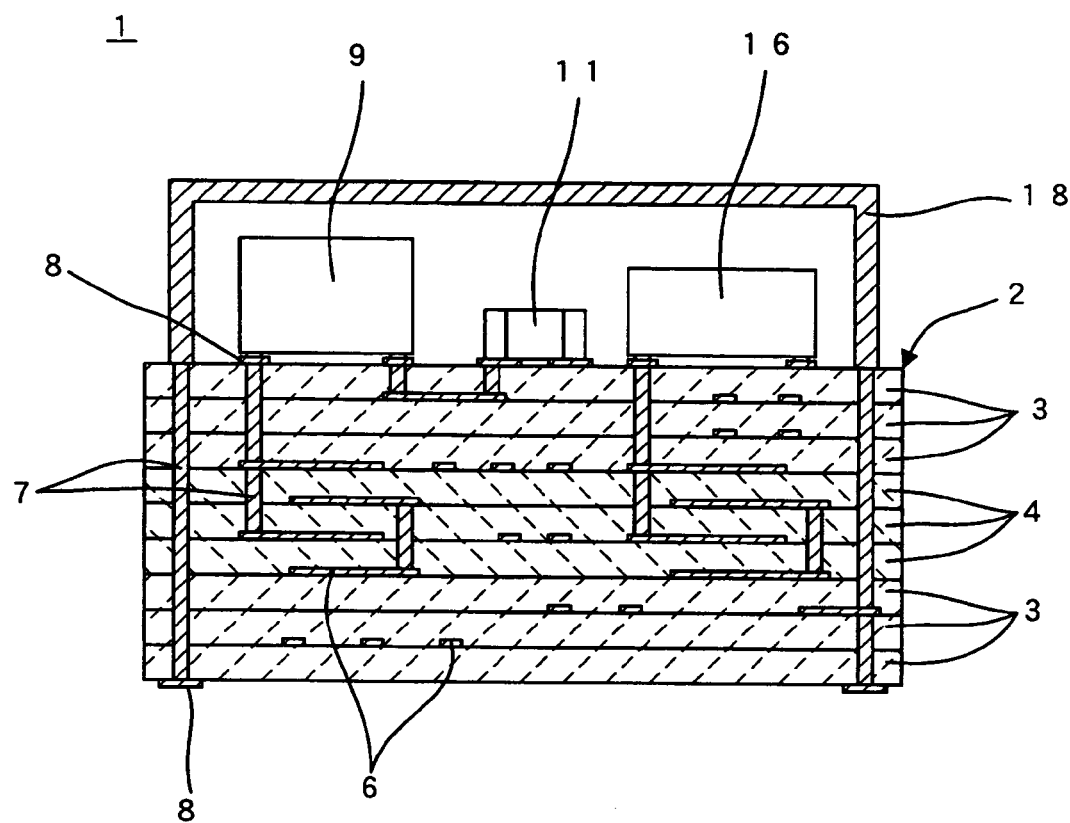
FIG. 1 is a sectional view of a multilayer ceramic module that is an example of a monolithic ceramic electronic component made of a glass-ceramic composition according to an embodiment of the present invention.

A glass-ceramic composition according to an embodiment of the present invention contains first ceramic particles principally containing forsterite ($Mg_2SiO_4$); second ceramic particles principally containing at least one selected from the group consisting of calcium titanate ($CaTiO_3$), strontium titanate ($SrTiO_3$), and titanium oxide ($TiO_2$); and borosilicate glass particles. The composition of the borosilicate glass particles is particularly notable.

The borosilicate glass particles preferably contain about 3% to 15% lithium oxide ($Li_2O$), about 20% to 50% magnesium oxide (MgO), about 15% to 30% boron oxide ($B_2O_3$), about 10% to 45% silicon oxide ($SiO_2$), about 6% to 20% zinc oxide (ZnO), and 0% to about 15% aluminum oxide ($Al_2O_3$) on a weight basis. Since the composition of the borosilicate glass particles is suitable for forming $Li_2(Mg, Zn)SiO_4$ grains, there is an advantage in that a sintered body made of the glass-ceramic composition has a high Q value and high reliability (humidity resistance).

Lithium contained in the borosilicate glass particles is an element for forming the $Li_2(Mg, Zn)SiO_4$ grains and is effective in reducing the sintering temperature of the borosilicate glass particles. The reason for limiting the $Li_2O$ content of the borosilicate glass particles to the range of about 3% to 15% by weight is that when the $Li_2O$ content is less than about 3% by weight, a dense sintered body cannot be formed by firing the glass-ceramic composition at about 1,000° C. or less, the $Li_2(Mg, Zn)SiO_4$ grains are not formed during firing, and the sintered body has a low Q value. In contrast, when the $Li_2O$ content is more than about 15% by weight, the $Li_2(Mg, Zn)SiO_4$ grains are not formed during firing and the sintered body has a low Q value, low chemical stability, and low insulation reliability. The $Li_2O$ content is more preferably about 4% to 10% by weight because the sintered body has a high Q value.

Magnesium in the borosilicate glass particles is an element for forming the $Li_2(Mg, Zn)SiO_4$ grains and is effective in reducing the melting point of the borosilicate glass particles during glass preparation. The reason for limiting the MgO content of the borosilicate glass particles to the range of about 20% to 50% by weight is that when the MgO content is less than about 20% by weight, the $Li_2(Mg, Zn)SiO_4$ grains are not formed during firing and the sintered body has a low Q value. In contrast, when the MgO content is more than about 50% by weight, devitrification is caused.

The term "devitrification" means that glass is partially crystallized. Glass containing specific components is usually crystallized in a step of quenching molten raw materials thereof, that is, devitrification occurs. The amount of precipitated crystal grains fluctuates depending on cooling conditions. This can affect the sinterability of glass-ceramic compositions and/or dielectric properties of glass-ceramic sintered bodies. There is a technique for sintering a glass-ceramic material using a decrease in the viscosity of molten glass. In this technique, a fluctuation in the amount of crystal grains created by the partial crystallization of glass probably affects the sinterability of glass-ceramic compositions and/or dielectric properties of glass-ceramic sintered bodies. The high degree of crystallization can prevent the sintering of these glass-ceramic compositions.

The MgO content is more preferably about 30% to 45% by weight. This leads to an increase in the Q value of sintered bodies.

The reason for limiting the $B_2O_3$ content of the borosilicate glass particles to the range of about 15% to 30% by weight is that when the $B_2O_3$ content is less than about 15% by weight, vitrification hardly occurs in the glass-ceramic composition. In contrast, when the $B_2O_3$ content is more than about 30% by weight, the sintered body has low humidity resistance, low crystallinity, a low Q value, low chemical stability, and low insulation reliability.

The term "vitrification" means that an amorphous material (glassy material) is not formed because the content of an oxide for forming a network, such as $SiO_2$ or $B_2O_3$, is insufficient. The insufficient content of such a network-forming oxide causes the formation of a calcine.

The $B_2O_3$ content is more preferably about 15% to 25% by weight. This leads to an increase in the Q value of the sintered body and an increase in the reactivity of borosilicate glass with $CaTiO_3$, $SrTiO_3$, and $TiO_2$.

Silicon contained in the borosilicate glass is an element for forming the $Li_2(Mg, Zn)SiO_4$ grains. The reason for limiting the $SiO_2$ content of the borosilicate glass particles to the range of about 10% to 45% by weight is that when the $SiO_2$ content is less than about 10% by weight, the sintered body is chemically unstable and devitrification occurs. In contrast, when the $SiO_2$ content is more than about 45% by weight, the glass-ceramic composition is hardly sintered at about 1,000° C. or less. The $SiO_2$ content is more preferably about 15% to 30% by weight. This leads to an increase in the Q value of the sintered body.

Zinc contained in the borosilicate glass is an element for forming the $Li_2(Mg, Zn)SiO_4$ grains and is effective in increasing the Q value of the sintered body. The reason for limiting the ZnO content of the borosilicate glass particles to the range of about 6% to 20% by weight is that when the ZnO content is less than about 6% by weight, the $Li_2(Mg, Zn)SiO_4$ grains are not formed in the sintered body and the sintered body has low chemical stability and insulation reliability. In contrast, when the ZnO content is more than about 20% by weight, the sintered body has low chemical stability and insulation reliability.

Some types of borosilicate glass contain no aluminum. However, since the borosilicate glass particles contain about 15% by weight or less $Al_2O_3$, the sintered body has high chemical stability. In the glass-ceramic composition, $Al_2O_3$ serves as an oxide for forming a network to prevent the devitrification of the borosilicate glass. The devitrification is the partial crystallization of glass during manufacture is described above and the use of partially crystallized glass causes a difference in sinterability and/or electrical properties. When the $Al_2O_3$ content of the borosilicate glass particles is more than about 15% by weight, the glass-ceramic composition is hardly sintered. The $Al_2O_3$ content is more preferably about 10% by weight or less.

The glass-ceramic composition preferably contains about 3% to 20% by weight borosilicate glass particles.

When the content of the borosilicate glass particles is less than about 3% by weight, a dense sintered body cannot be formed by firing the glass-ceramic composition at about 1,000° C. or less. In contrast, when content of the borosilicate glass particles is more than about 20% by weight, the manufacturing cost of the glass-ceramic composition is high because the borosilicate glass particles are expensive. An increase in the amount of borosilicate glass usually causes a reduction in the amount of the crystal grains. This leads to a decrease in the Q value of the sintered body.

That is, the content of the borosilicate glass particles is preferably about 3% by weight or more and more preferably close to about 3% by weight. The content of the borosilicate glass particles is preferably about 20% by weight or less and more preferably about 15% by weight or less. A reduction in the content of the borosilicate glass particles allows the reaction of the second ceramic particles with the borosilicate glass particles to be readily controlled. The temperature coefficient of resonant frequency of the sintered body can be readily adjusted by controlling the content of the second ceramic particles.

In order to allow the sintered body to have high insulation reliability, the borosilicate glass particles preferably further contain at least one additive selected from the group consisting of calcium oxide (CaO), barium oxide (BaO), and strontium oxide (SrO).

The lower limit of the additive content of the borosilicate glass particles is about 2% and the upper limit of the additive content is about 15%, 25%, or 25% when the additive is CaO, BaO, or SrO, respectively, on a weight basis.

When the additive content is less than about 2% by weight, the sintered body has low insulation reliability. When the additive is CaO and the additive content is more than about 15% by weight, the sintered body has a low Q value and low insulation reliability. When the additive is BaO or SrO and the additive content is more than about 25% by weight, the sintered body has a low Q value.

CaO, BaO, and SrO may be used in combination such that the sintered body has higher insulation reliability.

The content of the first ceramic particles in the glass-ceramic composition is preferably about 55% or more and the content of the second ceramic particles is preferably about 6% to 30% on a weight basis. Forsterite contained in the first ceramic particles has a temperature coefficient of resonant frequency of about −60 ppm/° C. $CaTiO_3$, $SrTiO_3$, and $TiO_2$, at least one of which is contained in the second ceramic particles, have a temperature coefficient of resonant frequency of about 800, 1,700, and 450 ppm/° C., respectively. The borosilicate glass particles have a negative temperature coefficient of resonant frequency. The first and second ceramic particles and the borosilicate glass particles are preferably mixed together such that the glass-ceramic composition has a temperature coefficient of resonant frequency of about −30 to 30 ppm/° C.

Forsterite contained in the first ceramic particles preferably has a MgO to $SiO_2$ ratio between about 1.92 and 2.04 on a molar basis. This is because when the MgO to $SiO_2$ ratio is less than about 1.92 or more than about 2.04, the sintered body is chemically unstable. The first ceramic particles need not contain any component other than forsterite or may contain a trace amount of at least one of quartz ($SiO_2$), MgO, and steatite ($MgSiO_3$).

The content of impurities in the first ceramic particles is preferably about 5% by weight or less. When the impurity content is more than about 5% by weight, the sintered body has a low Q value and is chemically unstable. Examples of such impurities include $Al_2O_3$, $B_2O_3$, CaO, $Fe_2O_3$, $MnO_2$, NiO, $SnO_2$, SrO, ZnO, $P_2O_5$, $TiO_2$, $ZrO_2$, $Li_2O$, and $K_2O$.

The first ceramic particles preferably have a median diameter, D50, of about 1 μm or less. When the median diameter thereof is greater than about 1 μm, a dense sintered body cannot be prepared even if the content of the borosilicate glass particles is about 3% to 20% by weight.

The second ceramic particles are useful in adjusting the temperature coefficient of resonant frequency of the sintered body.

When the second ceramic particles principally contain $CaTiO_3$, the content of $CaTiO_3$ in the glass-ceramic composition is preferably about 18% by weight or less. This is because when the $CaTiO_3$ content is about more than 18% by weight, the sintered body has a low Q value and a high dielectric constant. This affects the transmission speed of the sintered body used at high frequencies.

When the second ceramic particles principally contain $SrTiO_3$, the content of $SrTiO_3$ in the glass-ceramic composition is preferably about 13% by weight or less. This is because when the $SrTiO_3$ content is about more than 13% by weight, the sintered body has a low Q value and a high dielectric constant. This affects the transmission speed of the sintered body used at high frequencies.

$TiO_2$ is effective in increasing the crystallinity of the sintered body. In order to sufficiently increase the crystallinity thereof, when the second ceramic particles principally contain $TiO_2$, the content of $TiO_2$ in the glass-ceramic composition is preferably about 0.3% by weight or more. Furthermore, the $TiO_2$ content is preferably about 30% by weight or less. This is because when the $TiO_2$ content is more than about 30% by weight, the sintered body has a high dielectric constant. This affects the transmission speed of the sintered body used at high frequencies.

When the second ceramic particles contain $CaTiO_3$ and $TiO_2$, it is preferable that the content of $CaTiO_3$ in the glass-ceramic composition be about 8% to 12% and the content of $TiO_2$ therein be about 0.3% to 3% on a weight basis.

Alternatively, the second ceramic particles may contain $SrTiO_3$ and $TiO_2$. $SrTiO_3$ and $TiO_2$ are effective in adjusting the temperature coefficient of resonant frequency of the sintered body. $SrTiO_3$ is advantageous in that a $SrTiO_3$-containing sintered body has a dielectric constant less than that of a $CaTiO_3$-containing sintered body even though these sintered bodies have the same temperature coefficient of resonant frequency. $TiO_2$ is effective in enhancing glass crystallinity (that is, the Q value and the humidity reliability of the sintered body).

In the case that the second ceramic particles contain both $SrTiO_3$ and $TiO_2$, it is preferable that the content of $SrTiO_3$ in the glass-ceramic composition be about 6% to 10% and the content of $TiO_2$ therein be about 0.3% to 3% on a weight basis, in order to allow the sintered body to have a low dielectric constant and in order to enhance glass crystallinity.

When the $SrTiO_3$ content of the glass-ceramic composition is less than about 6% by weight, the sintered body has a large negative temperature coefficient of resonant frequency. In contrast, when the $SrTiO_3$ content is more than about 10% by weight, the sintered body has a low Q value. When the $TiO_2$ content of the glass-ceramic composition is less than about 0.3% by weight, the $Li_2(Mg, Zn)SiO_4$ grains are hardly formed. In contrast, when the $TiO_2$ content is more than about 3% by weight, the sintered body has a large positive temperature coefficient of resonant frequency.

When the second ceramic particles contain $SrTiO_3$, the molar ratio of SrO to $TiO_2$ is preferably between about 0.92 and 1.05.

When the SrO to $TiO_2$ ratio is more than about 1.05, excess SrO remains in the form of carbonate or reacts with a glass component to reduce the humidity reliability of the sintered body, the sintered body has a low Q value, and $Sr_2TiO_4$ grains or other grains are formed in some cases. The absolute value of the temperature coefficient of dielectric constant of $Sr_2TiO_4$ is less than that of $SrTiO_3$. Hence, in order to adjust the temperature coefficient of dielectric constant (Tcc) of the sintered body, the second ceramic particles must contain a large amount of $Sr_2TiO_4$. This leads to an increase in the Q value of the sintered body.

In contrast, when the SrO to $TiO_2$ ratio is less than about 0.92, $SrTiO_3$ and $TiO_2$ are precipitated in some cases. $TiO_2$ may be additionally added to the glass-ceramic composition; hence, the adjustment of the $SrTiO_3$ content and the $TiO_2$ content prevents problems with electrical properties. However, the adjustment of the $SrTiO_3$ content and the $TiO_2$ content during manufacturing steps is complicated and causes an increase in manufacturing cost.

When the second ceramic particles principally contain $SrTiO_3$, the content of impurities in the second ceramic particles is preferably about 1% by weight or less. The second ceramic particles are contaminated with such impurities during the preparation of raw materials and/or manufacturing steps. Examples of these impurities include $Nb_2O_5$, $Fe_2O_3$, and $Li_2O$. When the impurity content of the second ceramic particles is more than about 1% by weight, the sintered body has a low Q value.

When the second ceramic particles principally contain $SrTiO_3$, the second ceramic particles preferably have a specific surface area of about 1.5 to 7.5 $m^2/g$. When the specific surface area of the second ceramic particles is less than about 1.5 $m^2/g$, the second ceramic particles are hardly sintered in some cases. In contrast, when the specific surface area thereof is more than about 7.5 $m^2/g$, the sintered body has a low Q value because the second ceramic particles violently react with glass components. This causes a decrease in the Q value of the sintered body.

When the second ceramic particles principally contain $SrTiO_3$, the X-ray diffraction pattern of the second ceramic particles preferably has a peak, corresponding to the $SrTiO_3$ (222) plane, having an integrated intensity of about 1,000 or more. This is because when the integrated intensity is less than about 1,000, the crystallinity of the second ceramic particles is not high and the second ceramic particles violently react with glass components. This causes a decrease in the Q value of the sintered body.

The glass-ceramic composition can be sintered at about 1,000° C. or less. The sintered body prepared by firing the glass-ceramic composition contains $Mg_2SiO_4$ grains that are the major crystal grains and the $Li_2(Mg, Zn)SiO_4$ grains that are the minor crystal grains. The sintered body is suitable for monolithic ceramic electronic components.

The glass-ceramic composition may further contain third ceramic particles selected from the group consisting of copper oxide (CuO) particles, iron oxide ($Fe_2O_3$) particles, and manganese oxide ($MnO_2$) particles in addition to the first and second ceramic particles. It is preferable that the amount of the CuO particles be about 0.5 parts or less, that of the $Fe_2O_3$ particles be about one part or less, that of the $MnO_2$ particles be about two parts or less, and that of the third ceramic particles be about 2.5 parts or less with respect to 100 parts by weight of a mixture of the first and second ceramic particles and the borosilicate glass particles on a weight basis.

When the glass-ceramic composition contains the third ceramic particles, a dense sintered body can be prepared from the glass-ceramic composition even though the content of the borosilicate glass particles in the glass-ceramic composition is small. This leads to a complementary increase in the content of first ceramic particles, resulting in the formation of a sintered body with a Qf value of about 10,000 GHz or more and a temperature coefficient of resonant frequency of about −30 to 30 ppm/° C.

Figure 2:
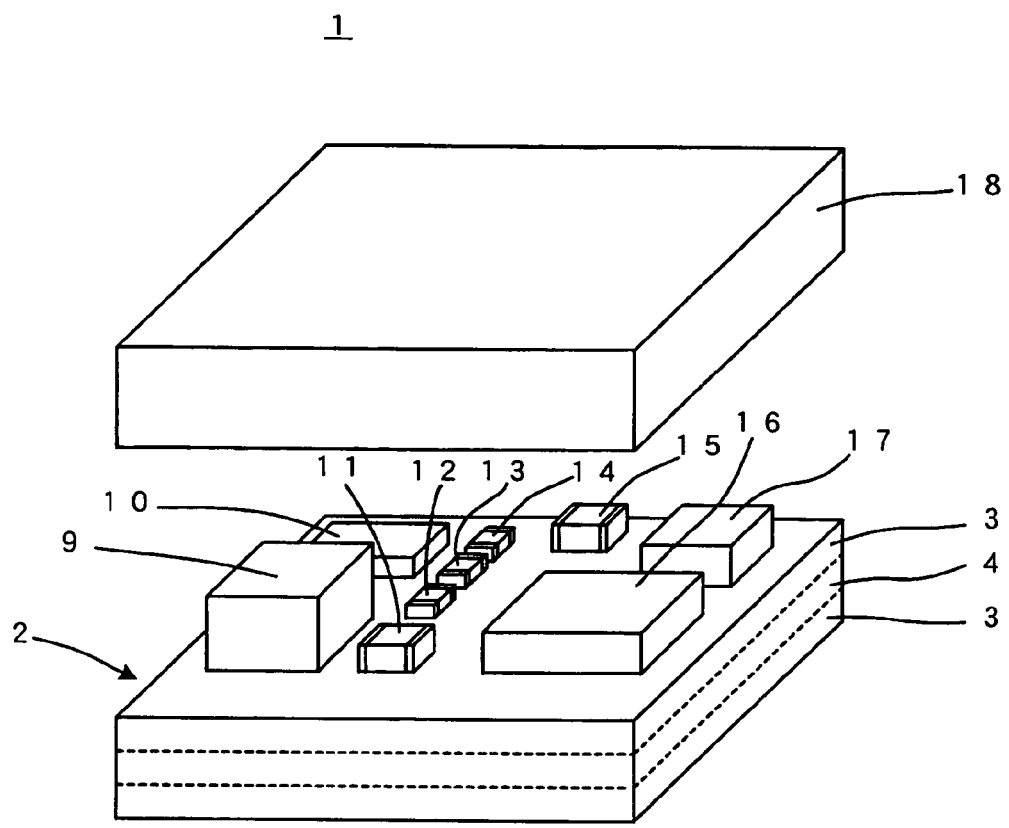
FIG. 2 is an exploded perspective view of the multilayer ceramic module shown in FIG. 1.

FIG. 1 is a sectional view of a multilayer ceramic module 1 that is an example of a monolithic ceramic electronic component made of the glass-ceramic composition. FIG. 2 is an exploded perspective view of the multilayer ceramic module 1 shown in FIG. 1.

The multilayer ceramic module 1 includes a multilayer ceramic substrate 2. The multilayer ceramic substrate 2 includes glass-ceramic sections each including a plurality of glass-ceramic layers 3 and a dielectric ceramic section including a plurality of dielectric ceramic layers 4. The dielectric ceramic section is sandwiched between the glass-ceramic sections.

The glass-ceramic layers 3 can be prepared by processing glass-ceramic sintered bodies prepared by firing the glass-ceramic composition and has a relatively low dielectric constant of about 10 or less.

The dielectric ceramic layers 4 are made of barium titanate and glass and have a dielectric constant of 15 or more and more preferably 30 or more.

The multilayer ceramic substrate 2 includes various wiring conductors such as internal conductive layers 6 disposed between some of the glass-ceramic layers 3 and dielectric ceramic layers 4, via-hole conductors 7 extending through some of the glass-ceramic layers 3 and dielectric ceramic layers 4, and external conductive layers 8 disposed on outer face of the multilayer ceramic substrate 2.

Some of the internal conductive layers 6 that are in contact with the dielectric ceramic layers 4 are arranged to give capacitance. These internal conductive layers 6 and dielectric ceramic layers 4 form capacitance elements.

The multilayer ceramic substrate 2 has a plurality of electronic components 9 to 17 arranged on the upper face thereof. For example, the electronic component 9 is a diode, the electronic component 11 is a monolithic ceramic capacitor, and the electronic component 16 is a semiconductor integrated circuit (IC). The electronic components 9 to 17 are electrically coupled with the corresponding external conductive layers 8. The electronic components 9 to 17 and the wiring conductors form circuits included in the multilayer ceramic module 1.

A conductive cap 18 for shielding the electronic components 9 to 17 is fixed on the upper face of the multilayer ceramic substrate 2. The conductive cap 18 is electrically coupled with some of the via-hole conductors 7.

The multilayer ceramic module 1 is mounted on a mother board (not shown) in such a manner that the multilayer ceramic module 1 is electrically coupled with the mother board with some of the external conductive layers 8 arranged on the lower face of the multilayer ceramic substrate 2 and which serve as connection terminals.

The multilayer ceramic module 1 can be manufactured by a known process for firing a ceramic compact.

That is, green glass-ceramic sheets for forming the glass-ceramic layers 3 are prepared. In particular, the glass-ceramic composition (that is, a starting composition) is mixed with an organic vehicle containing a binder resin and a solvent, whereby a ceramic slurry is prepared. The ceramic slurry is formed into a sheet-shaped material by a doctor blade process. The sheet-shaped material is dried and then blanked, whereby the green glass-ceramic sheets having a predetermined size are obtained. A conductive paste containing copper or silver is applied onto the green glass-ceramic sheets, whereby patterns for forming the wiring conductors are provided on the green glass-ceramic sheets.

On the other hand, green dielectric ceramic sheets containing a dielectric ceramic composition are prepared for forming the dielectric ceramic layers 4. Examples of the dielectric ceramic composition include the compositions specified in Items (1) to (4) below.

Figure 3:
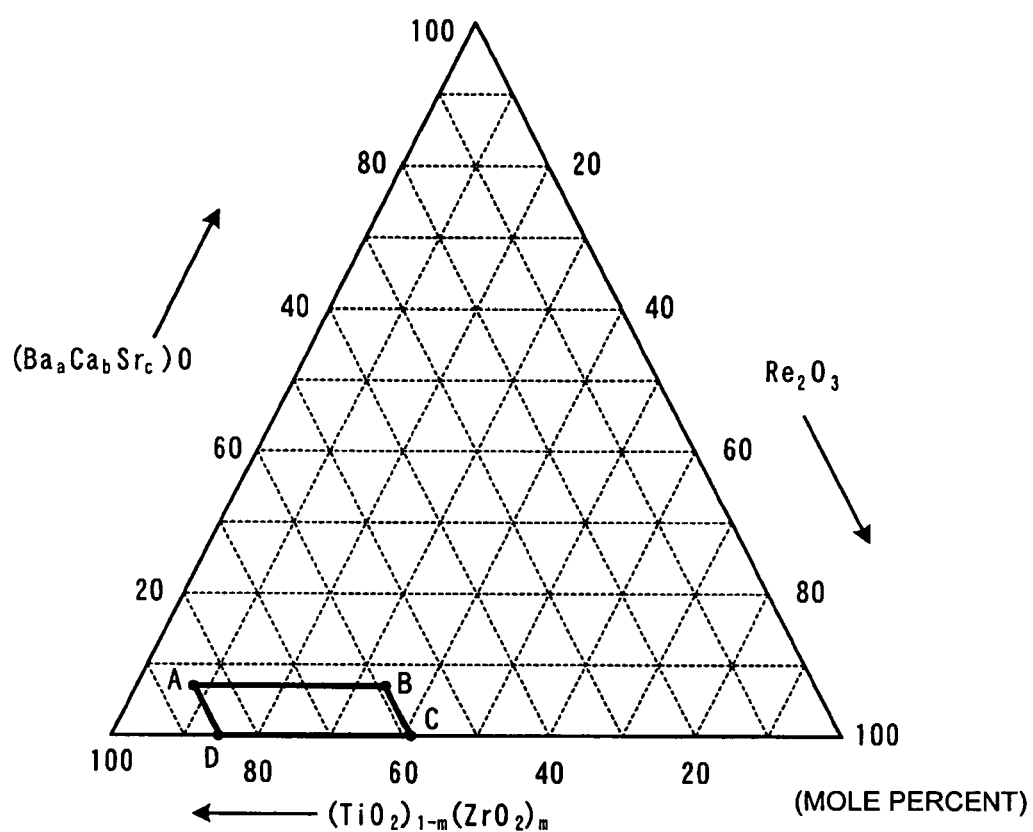
FIG. 3 is a ternary diagram showing the molar ratio of $(Ba_aCa_bSr_c)O$ to $(TiO_2)_{1-m}(ZrO_2)_m$ to $Re_2O_3$, these compounds being contained in a preferable dielectric material for forming dielectric ceramic layers included in the multilayer ceramic module.

(1) A dielectric ceramic composition, disclosed in Japanese Unexamined Patent Application Publication No. 2001-80959, containing a principal component, 0.1 to 25 parts of a first auxiliary component containing a $SiO_2$ glass subcomponent with respect to 100 parts of the principal component on a weight basis, and a second auxiliary component containing Mn, the amount of Mn being 0.5 to 20 parts with respect to 100 parts of the principal component on a weight basis, wherein the principal component is represented by the formula $x(Ba_aCa_bSr_c)O-y((TiO_2)_{1-m}(ZrO_2)_m)-zRe_2O_3$, the molar ratio of $(Ba_aCa_bSr_c)O$ to $(TiO_2)_{1-m}(ZrO_2)_m$ to $Re_2O_3$ is present in a region surrounded by points A (7, 85, 8), B (7, 59, 34), C (0, 59, 41), and D (0, 85, 15) in a ternary diagram shown in FIG. 3, the line between points A and B is excluded from the region, where x, y, and z are expressed in mole percent; x+y+z=100; a+b+c=1; $0 \leq b+c < 0.8$; $0 \leq m < 0.15$; and Re is at least one of rare earth elements.

(2) A dielectric ceramic composition, disclosed in Japanese Unexamined Patent Application Publication No. 2002-97072, containing a $BaO-TiO_2-ReO_{3/2}$ ceramic composition represented by the formula $xBaO-yTiO_2-zReO_{3/2}$ and a glass composition containing 10% to 25% $SiO_2$, 10% to 40% $B_2O_3$, 25% to 55% MgO, 0% to 20% ZnO, 0% to 15% $Al_2O_3$, 0.5% to 10% $Li_2O$, and 0% to 10% RO, wherein x, y, and z are expressed in mole percent; x+y+z=100; $8 \leq x \leq 18$; $52.5 \leq y \leq 65$; $20 \leq z \leq 40$; Re is a rare earth element; and R is at least one selected from the group consisting of Ba, Sr and Ca.

(3) A dielectric ceramic composition, disclosed in Japanese Unexamined Patent Application Publication No. 11-310455, containing $BaO-TiO_2-ReO_{3/2}-BiO_3$ ceramic particles and glass particles containing 13% to 50% $SiO_2$, 3% to 30% $B_2O_3$, 40% to 80% alkaline earth metal oxide, and 0.1% to 10% $Li_2O$ on a weight basis, wherein Re represents a rare earth element.

(4) A dielectric ceramic composition, disclosed in Japanese Unexamined Patent Application Publication No. 11-228222, containing $BaO-TiO_2-ReO_{3/2}$ ceramic particles and glass particles containing 13% to 50% $SiO_2$, 3% to 30% $B_2O_3$, 40% to 80% alkaline earth metal oxide, and 0.5% to 10% $Li_2O$ on a weight basis, wherein Re represents a rare earth element.

If the dielectric ceramic composition specified in Item (1) is used, the dielectric ceramic composition preferably further contains $Li_2O$.

For example, the dielectric ceramic composition specified in any one of Items (1) to (4) is mixed with an organic vehicle containing a binder resin and a solvent, whereby a ceramic slurry is prepared. The ceramic slurry is formed into a sheet-shaped material by a doctor blade process. The sheet-shaped material is dried and then blanked, whereby the green dielectric ceramic sheets having a predetermined size are obtained. A conductive paste containing copper or silver is applied onto the green dielectric ceramic sheets, whereby patterns for forming the wiring conductors are provided on the green dielectric ceramic sheets.

A predetermined number of the green glass-ceramic and dielectric ceramic sheets prepared as described above are stacked in a predetermined order and the stacked sheets are pressed in the thickness direction of the sheets, whereby a green compact is obtained.

The green compact is fired at about 1,000° C. or less, for example, about 800° C. to 1,000° C., whereby the multilayer ceramic substrate 2 can be obtained. When the wiring conductors principally contain copper or silver, the green compact is fired in a non-oxidizing atmosphere such as a nitrogen atmosphere or an oxidizing atmosphere such as an air atmosphere, respectively.

The electronic components 9 to 17 are fixed on the multilayer ceramic substrate 2 by soldering and the conductive cap 18 is attached to the resulting multilayer ceramic substrate 2, whereby the multilayer ceramic module 1 is completed.

Since the glass-ceramic layers 3 is made of the glass-ceramic composition and the wiring conductors principally contain copper or silver with low resistivity, the glass-ceramic layers 3 have a low dielectric constant, a satisfactory temperature coefficient of resonant frequency, and a high Q value. Hence, the multilayer ceramic module 1 is suitable for high-frequency applications and high insulation reliability.

Figure 4:
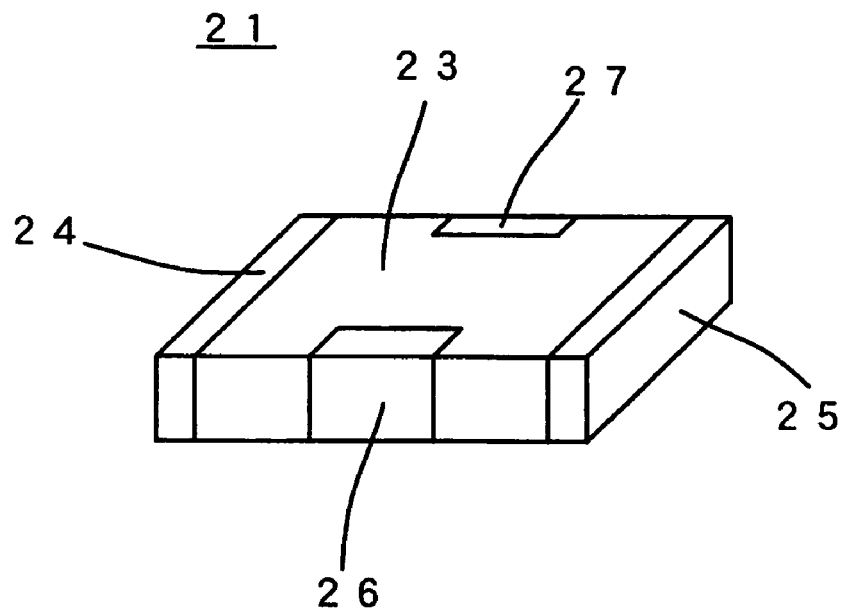
FIG. 4 is a perspective view of an LC filter that is an example of a monolithic ceramic electronic component made of a glass-ceramic composition according to an embodiment of the present invention.
Figure 5:
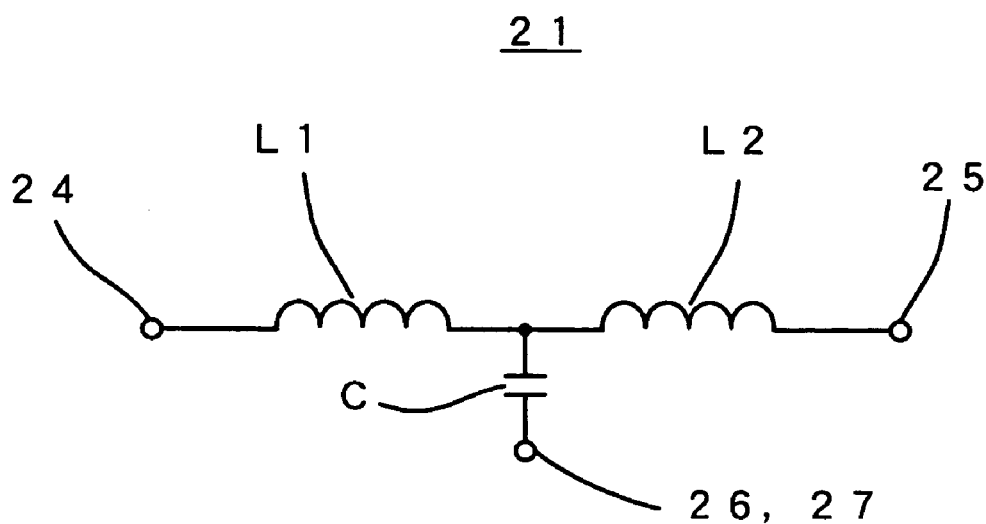
FIG. 5 is a diagram showing an equivalent circuit of the LC filter shown in FIG. 4.
Figure 6:
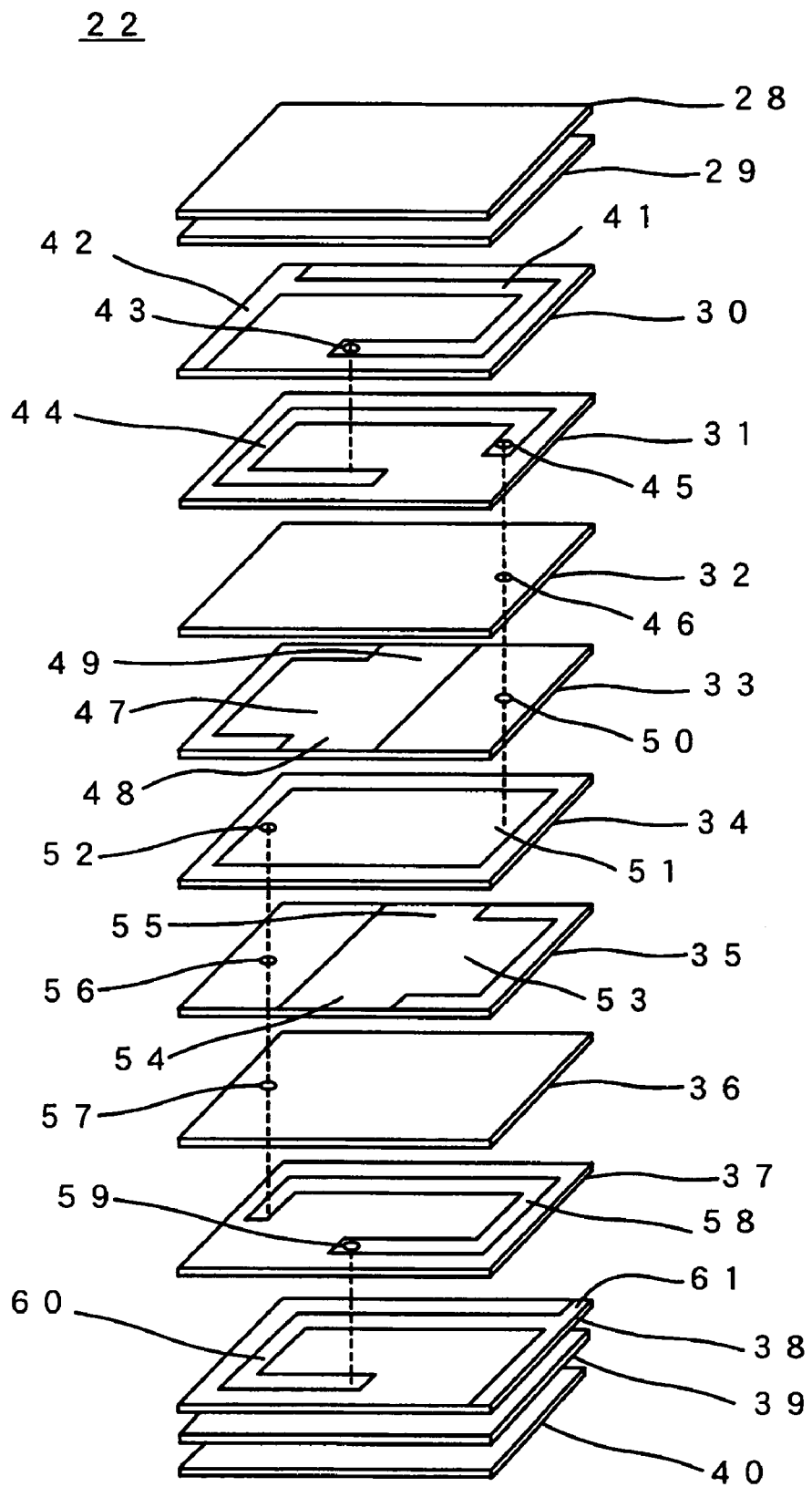
FIG. 6 is an exploded perspective view of a green compact fired during the manufacture of the LC filter.

FIG. 4 is a perspective view of an LC filter 21 that is another example of the monolithic ceramic electronic component made of the glass-ceramic composition. FIG. 5 is a diagram showing an equivalent circuit of the LC filter 21. FIG. 6 is an exploded perspective view of a green compact 22 fired during the manufacture of the LC filter 21.

With reference to FIG. 4, the LC filter 21 includes a component body 23 and terminal electrode 24 to 27. The component body 23 includes a plurality of stacked glass-ceramic layers. The terminal electrodes 24 and 25 are each disposed on corresponding end faces of the component body 23. The electrodes 26 and 27 are each disposed on intermediate portions of corresponding side faces of the component body 23.

With reference to FIG. 5, the equivalent circuit includes two inductors L1 and L2 which are connected to each other in series and are disposed between the terminal electrodes 24 and 25 and also includes a capacitor C disposed between a node between the inductors L1 and L2 and the terminal electrodes 26 and 27.

With reference to FIG. 6, the green compact 22 is to be used to prepare the component body 23 by firing and includes a plurality of green ceramic sheets 28 to 40. The number of green ceramic sheets used herein need not be equal to the number of the green ceramic sheets 28 to 40.

The green ceramic sheets 28 to 40 are prepared so as to have a predetermined size in such a manner that a ceramic slurry is prepared by mixing the glass-ceramic composition and an organic vehicle containing a binder resin and a solvent and then formed into a sheet-shaped material by a doctor blade process and the sheet-shaped material is dried and then blanked.

In order to form the inductors L1 and L2 and capacitor C shown in FIG. 5, the wiring conductors are provided on or in some of the green ceramic sheets 28 to 40 as described below.

A coil pattern 41 for forming a part of the inductor L1 is formed on the green ceramic sheet 30. A leading pattern 42 is formed on the green ceramic sheet 30 so as to extend from one end of the coil pattern 41 and a via-hole conductor 43 is provided at the other end thereof.

A coil pattern 44 for forming another part of the inductor L1 is formed on the green ceramic sheet 31. A via-hole conductor 45 is provided at one end of the coil pattern 44. The via-hole conductor 43 is connected to the other end of the coil pattern 44.

A via-hole conductor 46 is provided in the green ceramic sheet 32 so as to be connected to the via-hole conductor 45.

A capacitor pattern 47 for forming a part of the capacitor C is formed on the green ceramic sheet 33. Leading patterns 48 and 49 are formed on the green ceramic sheet 33 so as to extend from the capacitor pattern 47. A via-hole conductor 50 is provided in the green ceramic sheet 33 so as to be connected to the via-hole conductor 46.

A capacitor pattern 51 for forming another part of the capacitor C is formed on the green ceramic sheet 34 and a via-hole conductor 52 is provided in the green ceramic sheet 34 so as to be connected to the capacitor pattern 51. The capacitor pattern 51 is also connected to the via-hole conductor 50.

The following patterns are formed on the green ceramic sheet 35: a capacitor pattern 53 for forming another part of the capacitor C and leading patterns 54 and 55 extending from the capacitor pattern 53. A via-hole conductor 56 is provided in the green ceramic sheet 35 so as to be connected to the via-hole conductor 52.

A via-hole conductor 57 is provided in the green ceramic sheet 36 so as to be connected to the via-hole conductor 56.

A coil pattern 58 for forming a part of the inductor L2 is formed on the green ceramic sheet 37 and a via-hole conductor 59 is provided in the green ceramic sheet 37 so as to extend from one end of the coil pattern 58. The other end of the coil pattern 58 is connected to the via-hole conductor 57.

A coil pattern 60 for forming another part of the inductor L2 is formed on the green ceramic sheet 38 and a leading pattern 61 is provided on the green ceramic sheet 38 so as to extend from one end of the coil pattern 60. The other end of the coil pattern 60 is connected to the via-hole conductor 59.

A conductive paste principally containing copper or silver is used to form the wiring conductors, that is, the coil patterns 41, 44, 58, and 60; the leading patterns 42, 48, 49, 54, 55, and 61; the via-hole conductors 43, 45, 46, 50, 52, 56, 57, and 59; and the capacitor patterns 47, 51, and 53. For example, a screen printing process is used to apply the conductive paste onto the green ceramic sheets 30 to 38.

The green ceramic sheets 28 to 40 are stacked in the order shown in FIG. 6 and then pressed in the thickness direction thereof, whereby the green compact 22 is obtained.

The green compact 22 is fired at about 1,000° C. or less, for example, about 800° C. to 1,000° C., whereby the component body 23 shown in FIG. 4 is obtained. In this firing step, as well as that included in the known process for manufacturing the multilayer ceramic module 1, a non-oxidizing atmosphere such as a nitrogen atmosphere or an oxidizing atmosphere such as an air atmosphere is used when the wiring conductors principally contain copper or silver, respectively.

The terminal electrode 24 to 27 are formed on the component body 23. In order to form the component body 23, the following process are preferably used: a process for applying a conductive paste principally containing copper or silver onto the component body 23 or and then firing the conductive paste, a deposition process, a plating process, a sputtering process, a thin-film forming process, or another process.

The LC filter 21 can be obtained as described above.

Although the green ceramic sheets 28 to 40 are made of the glass-ceramic composition as described above, the green ceramic sheets 33 and 34 may be made of the dielectric ceramic composition used to form the dielectric ceramic layers 4 included in the multilayer ceramic module 1 shown in FIG. 1.

The monolithic ceramic electronic component made of the glass-ceramic composition is not limited to the multilayer ceramic module 1 or the LC filter 21. The glass-ceramic composition can be used to manufacture various multilayer ceramic substrates such as multilayer ceramic substrates for multi-chip modules or hybrid ICs, various complex electronic components including such multilayer ceramic substrates and electronic elements mounted thereon, and chip-type monolithic electronic components such as chip-type monolithic capacitors and chip-type monolithic dielectric antennas.

Experiments performed to evaluate properties of sintered bodies made of glass-ceramic compositions within the scope of the present invention will now be described.

As shown in Table 1, various types of borosilicate glass were prepared for the manufacture of the glass-ceramic compositions and used as glass samples.

With reference to Table 1, the glass samples asterisked are outside the scope of the present invention.

The glass samples other than Glass Samples G8, G9, and G13 that were devitrified or not vitrified were pulverized into particles (referred to as borosilicate glass particles) with an average size of about 1 to 2 μm. The borosilicate glass particles were used to manufacture the glass-ceramic compositions.

The following particles for preparing the glass-ceramic compositions were also prepared: first ceramic particles which contained $Mg_2SiO_4$ and which had an average size (median diameter, D50) of about 0.8 μm and second ceramic particles which contained $CaTiO_3$, $SrTiO_3$, or $TiO_2$ and which had an average size of about 1.5, 1.5, or 1.0 μm, respectively.

The glass-ceramic compositions were obtained by mixing the borosilicate glass particles and the first and second ceramic particles and used as composition samples shown in Table 2.

TABLE 1

| Glass samples | $Li_2O$ (weight percent) | MgO (weight percent) | BaO (weight percent) | CaO (weight percent) | SrO (weight percent) | $B_2O_3$ (weight percent) | $SiO_2$ (weight percent) | ZnO (weight percent) | $Al_2O_3$ (weight percent) | Remarks |
|---|---|---|---|---|---|---|---|---|---|---|
| G1* | 2 | 33 | 3 | — | 2 | 25 | 27 | 8 | — | |
| G2 | 3.5 | 33 | 2 | 1 | 2 | 25 | 25.5 | 8 | — | |
| G3 | 15 | 23 | 2 | — | 7 | 20 | 23 | 10 | — | |
| G4* | 16.5 | 25 | 7 | — | — | 20 | 21.5 | 10 | — | |

TABLE 1-continued

| Glass samples | Li$_2$O (weight percent) | MgO (weight percent) | BaO (weight percent) | CaO (weight percent) | SrO (weight percent) | B$_2$O$_3$ (weight percent) | SiO$_2$ (weight percent) | ZnO (weight percent) | Al$_2$O$_3$ (weight percent) | Remarks |
|---|---|---|---|---|---|---|---|---|---|---|
| G5* | 6 | 18 | 5 | — | 5 | 26 | 28 | 8 | 4 | |
| G6 | 6 | 23 | 2 | 2 | 3 | 26 | 26 | 8 | 4 | |
| G7 | 5 | 45 | 4 | — | — | 22 | 18 | 6 | — | |
| G8* | 5 | 52 | 4 | — | — | 18 | 15 | 6 | — | Devitrified |
| G9* | 8 | 34 | 3 | 1 | 6 | 14 | 25 | 7 | 2 | Not devitrified |
| G10 | 8 | 34 | 3 | 2 | 3 | 16 | 25 | 7 | 2 | |
| G11 | 6 | 24 | 3 | 1 | 6 | 29 | 21 | 10 | — | |
| G12* | 6 | 23 | 3 | 1 | 6 | 31 | 20 | 10 | — | |
| G13* | 10 | 33 | 3 | 2 | 5 | 23 | 9 | 10 | 5 | Devitrified |
| G14 | 10 | 38 | 3 | — | — | 23 | 11 | 10 | 5 | |
| G15 | 5 | 33 | 5 | — | 8 | 18 | 25 | 6 | — | |
| G16* | 6 | 23 | 4 | — | — | 15 | 46 | 6 | — | |
| G17* | 6 | 25 | 3 | — | 3 | 28 | 31 | 4 | — | |
| G18 | 6 | 25 | 3 | — | 5 | 24 | 31 | 6 | — | |
| G19 | 6 | 29 | 2 | 5 | 1 | 19 | 18 | 20 | — | |
| G20* | 6 | 30 | 5 | — | — | 19 | 18 | 22 | — | |
| G21* | 6 | 30 | — | — | 5 | 20 | 15 | 8 | 16 | |
| G22 | 6 | 27 | 3 | 1 | 4 | 20 | 16.5 | 8 | 14.5 | |
| G23* | 5 | 25 | 27 | — | — | 17 | 19 | 7 | — | |
| G24 | 5 | 23 | 25 | — | — | 18 | 23 | 6 | — | |
| G25 | 4 | 33 | 16 | — | — | 17 | 23 | 7 | — | |
| G26* | 6 | 28 | 1 | 16 | — | 18 | 24 | 7 | — | |
| G27 | 6 | 35 | 1 | 10 | — | 19 | 23 | 6 | — | |
| G28* | 6 | 22 | 1 | — | 27 | 16 | 22 | 6 | — | |
| G29 | 6 | 22 | 1 | — | 25 | 18 | 20 | 8 | — | |
| G30 | 6 | 32 | 1 | — | 12 | 19 | 23 | 7 | — | |

TABLE 2

| Composition samples | Contents of first ceramic particles[1] (weight percent) | Borosilicate glass particles | | Second ceramic particles | |
|---|---|---|---|---|---|
| | | Glass samples | Contents[2] (weight percent) | Types[3] | Contents[4] (weight percent) |
| 1* | 70.0 | G1 | 20.0 | CT | 10.0 |
| 2 | 70.0 | G2 | 20.0 | CT | 10.0 |
| 3 | 85.0 | G3 | 3.0 | CT | 12.0 |
| 4* | 85.0 | G4 | 3.0 | CT | 12.0 |
| 5* | 77.0 | G5 | 15.0 | ST | 8.0 |
| 6 | 77.0 | G6 | 15.0 | ST | 8.0 |
| 7 | 74.0 | G7 | 15.0 | ST | 11.0 |
| 8 | 75.0 | G10 | 15.0 | ST | 10.0 |
| 9 | 72.0 | G11 | 15.0 | ST | 13.0 |
| 10* | 78.0 | G12 | 15.0 | CT | 7.0 |
| 11 | 84.0 | G14 | 8.0 | CT | 8.0 |
| 12 | 84.0 | G15 | 9.0 | ST | 7.0 |
| 13* | 74.0 | G16 | 18.0 | CT | 8.0 |
| 14* | 75.0 | G17 | 15.0 | CT | 10.0 |
| 15 | 75.0 | G18 | 15.0 | CT | 10.0 |
| 16 | 72.0 | G19 | 20.0 | ST | 8.0 |
| 17* | 72.0 | G20 | 20.0 | ST | 8.0 |
| 18* | 66.5 | G21 | 19.0 | CT | 14.5 |
| 19 | 66.5 | G22 | 19.0 | CT | 14.5 |
| 20* | 80.0 | G23 | 10.0 | ST | 10.0 |
| 21 | 80.0 | G24 | 10.0 | ST | 10.0 |
| 22 | 79.0 | G25 | 10.0 | CT | 11.0 |
| 23* | 79.0 | G26 | 10.0 | CT | 11.0 |
| 24 | 79.0 | G27 | 10.0 | CT | 11.0 |
| 25* | 82.0 | G28 | 10.0 | ST | 8.0 |
| 26 | 82.0 | G29 | 10.0 | ST | 8.0 |
| 27 | 82.0 | G30 | 10.0 | ST | 8.0 |
| 28* | 85.0 | G15 | 2.0 | ST | 13.0 |
| 29 | 76.0 | G15 | 9.0 | T | 15.0 |
| 30 | 79.0 | G15 | 9.0 | CT | 12.0 |
| 31 | 74.0 | G15 | 10.0 | ST | 6.0 |
| 32 | 80.0 | G15 | 9.0 | CT/T | 10.0/1.0 |
| 33 | 80.0 | G15 | 9.0 | ST/T | 10.0/1.0 |
| 34 | 83.5 | G15 | 9.0 | ST/T | 6.5/1.0 |
| 35 | 85.0 | G15 | 9.0 | ST/T | 5.0/1.0 |
| 36 | 80.5 | G15 | 9.0 | ST/T | 7.0/5.5 |
| 37 | 83.4 | G15 | 10.0 | ST/T | 6.5/0.1 |

TABLE 2-continued

| Composition samples | Contents of first ceramic particles[1] (weight percent) | Borosilicate glass particles | | Second ceramic particles | |
|---|---|---|---|---|---|
| | | Glass samples | Contents[2] (weight percent) | Types[3] | Contents[4] (weight percent) |
| 38 | 80.5 | G15 | 10.0 | ST/T | 6.5/3.0 |
| 39 | 81.0 | G15 | 10.0 | CT/T | 8.0/1.0 |
| 40 | 77.0 | G15 | 10.0 | CT/T | 12.0/1.0 |
| 41 | 55.0 | G15 | 10.0 | T | 35.0 |
| 42 | 60.0 | G15 | 10.0 | T | 30.0 |
| 43 | 78.0 | G15 | 8.0 | ST | 14.0 |
| 44 | 73.0 | G15 | 9.0 | CT | 18.0 |
| 45 | 71.0 | G15 | 9.0 | CT | 20.0 |

[1]The contents of the first ceramic particles in the composition samples.
[2]The contents of the borosilicate glass particles in the composition samples.
[3]CT, ST, and T represent $CaTiO_3$, $SrTiO_3$, and $TiO_2$, respectively, contained in the second ceramic particles.
[4]The contents of the second ceramic particles in the composition samples.

With respect to Table 2, the composition samples asterisked are outside the scope of the present invention.

The following materials were mixed together: about 100 parts by weight of each composition sample shown in Table 2, about 20 parts by weight of an acrylic resin serving as a binder, and about 30 parts by weight of methyl ethyl ketone serving as a solvent. The mixture was formed into particles, which were subjected to press molding, whereby a substantially cylindrical compact was prepared. The compact was fired at about 1,000° C. or less, whereby a glass-ceramic sintered body used as a sample was obtained.

These samples were evaluated for dielectric constant, Qf value, temperature coefficient of resonant frequency, and chemical stability.

The dielectric constant, the Qf value, the temperature coefficient of resonant frequency were determined by a dielectric resonator method. The size of each sample was adjusted such that the sample resonated at a frequency of 10 GHz.

After being used for the determination of the above properties, these samples were evaluated for chemical stability in such a manner that these samples were subjected to a pressure cooker test (PCT) at about 120° C. for about 100 hours in an atmosphere having a relative humidity of about 95% and then checked whether these resulting samples had seriously lower Qf values as compared to those of these untreated samples. With reference to Table 2, some of these samples of which the Qf values were only slightly decreased have a rating of "A" because of their high chemical stability and the others which the Qf values were seriously decreased have a rating of "B" because of their low chemical stability.

Table 3 shows the evaluation of insulation stability. Each monolithic capacitors used as a sample in this evaluation was prepared as follows: slurry was prepared by mixing the glass-ceramic composition for preparing each sample shown in Table 2, a binder, and an organic solvent and then formed into sheets, a conductive paste for forming internal conductors was applied onto the sheets by a printing process, and the resulting sheets were stacked, pressed, and then fired. The capacitor samples were subjected to an accelerated test under the following conditions: a temperature of about 120° C., a relative humidity of about 95%, an applied DC voltage of about 15 V, and a testing time of about 100 hours. With reference to Table 3, some of the capacitor samples of which insulation properties were not seriously deteriorated have a rating of "A" because of their high insulation stability and the others of which insulation properties were deteriorated have a rating of "B" because of their low insulation stability.

TABLE 3

| Capacitor samples | $\epsilon_r$[1] | Qf value (GHz) | $\tau_f$[2] (ppm/° C.) | Chemical stability | Insulation reliability |
|---|---|---|---|---|---|
| 1* | Not prepared due to failure in sintering | | | | |
| 2 | 9.5 | 28000 | −5 | A | A |
| 3 | 11.2 | 10500 | 5 | A | A |
| 4* | 9.8 | 8500 | −15 | B | B |
| 5* | 8.9 | 4800 | −15 | A | A |
| 6 | 9.1 | 12000 | −10 | A | A |
| 7 | 10.5 | 39000 | 12 | A | A |
| 8 | 9.5 | 36000 | 11 | A | A |
| 9 | 18 | 20000 | 60 | A | A |
| 10* | 8.3 | 3800 | 20 | B | B |
| 11 | 9.2 | 26000 | −10 | A | A |
| 12 | 8.9 | 39000 | 5 | A | A |
| 13* | Not prepared due to faiure in sintering | | | | |
| 14* | 10.5 | 24000 | −25 | B | B |
| 15 | 10.5 | 38500 | −22 | A | A |
| 16 | 8.9 | 39000 | −20 | A | A |
| 17* | 8.9 | 39500 | −22 | B | B |
| 18* | Not prepared due to failure in sintering | | | | |
| 19 | 12.4 | 18000 | 18 | A | A |
| 20* | 11.0 | 1500 | 15 | A | A |
| 21 | 10.5 | 5500 | 14 | A | A |
| 22 | 9.5 | 20000 | 6 | A | A |
| 23* | 8.8 | 20000 | −5 | B | B |
| 24 | 9.0 | 32000 | 5 | A | A |
| 25* | 9.8 | 4400 | 8 | A | A |
| 26 | 9.7 | 12000 | 9 | A | A |
| 27 | 9.5 | 38000 | 6 | A | A |
| 28* | Not prepared due to failure in sintering | | | | |
| 29 | 10.5 | 29000 | −15 | A | A |
| 30 | 9.0 | 31500 | 4 | A | A |
| 31 | 8.8 | 37000 | −5 | A | A |
| 32 | 11.0 | 48000 | 6 | A | A |
| 33 | 10.5 | 41000 | 10 | A | A |
| 34 | 8.9 | 52000 | 5 | A | A |
| 35 | 8.2 | 51000 | −12 | A | A |
| 36 | 10.2 | 32000 | 15 | A | A |
| 37 | 8.5 | 26000 | 31 | A | A |
| 38 | 9.5 | 36000 | 9 | A | A |
| 39 | 8.4 | 41000 | −9 | A | A |
| 40 | 9.8 | 40500 | 8 | A | A |
| 41 | 22 | 12000 | 50 | A | A |
| 42 | 18.0 | 15000 | 37 | A | A |
| 43 | 14.0 | 4500 | 51 | A | A |
| 44 | 16.0 | 11000 | 45 | A | A |
| 45 | 17.8 | 3800 | 48 | A | A |

[1]$\epsilon_r$ represents the dielectric constant.
[2]$\tau_f$ represents the temperature coefficient of resonant frequency.

In Table 3, the capacitor samples asterisked are outside the scope of the present invention.

As is clear from Tables 2 and 3, the capacitor samples having no asterisk contain the borosilicate glass particles within the scope of the present invention as shown in Table 1, the first ceramic particles containing $Mg_2SiO_4$, and the second ceramic particles contain at least one selected from the group consisting of $CaTiO_3$, $SrTiO_3$, and $TiO_2$; hence, the capacitor samples can be prepared by firing the glass-ceramic compositions containing these particles at about 1,000° C. or less, have high chemical stability and insulation stability, and exhibit high Qf values and the temperature coefficients of resonant frequency thereof are only slightly varied by the accelerated test.

In contrast, Glass Sample G1 has a $Li_2O$ content of less than about 3% by weight; hence, Composition Sample 1 prepared using Glass Sample G1 as shown in Table 2 is not sintered at about 1,000° C. or less and Capacitor Sample 1 cannot be prepared as shown in Table 3. Glass Sample G4 has a $Li_2O$ content of more than about 15% by weight; hence, Capacitor Sample 4 prepared using Glass Sample G4 exhibits a low Qf value and has low chemical stability and insulation reliability.

Glass Sample G5 has a MgO content of less than about 20% by weight; hence, Capacitor Sample 5 prepared using Glass Sample G5 exhibits a low Qf value. Glass Sample G8 has a MgO content of more than about 50% by weight and is therefore devitrified.

Glass Sample G9 has a $B_2O_3$ content of less than about 15% by weight and is therefore hardly vitrified. Glass Sample G12 has a $B_2O_3$ content of more than about 30% by weight; hence, Capacitor Sample 10 prepared using Glass Sample G12 exhibits a low Qf value and has low chemical stability and insulation reliability.

Glass Sample G13 has a $SiO_2$ content of less than about 10% by weight and is therefore devitrified. Glass Sample G16 has a $SiO_2$ content of more than about 45% by weight; hence, Composition Sample 13 prepared using Glass Sample G16 is not sintered at about 1,000° C. or less.

Glass Sample G17 has a ZnO content of less than about 6% by weight; hence, Capacitor Sample 14 prepared using Glass Sample G17 has low chemical stability. Glass Sample G20 has a ZnO content of more than about 20% by weight; hence, Capacitor Sample 17 prepared using Glass Sample G20 has low chemical stability and insulation reliability.

Glass Sample G21 has an $Al_2O_3$ content of more than about 15% by weight; hence, Composition Sample 18 prepared using Glass Sample G21 is not sintered at about 1,000° C. or less.

Glass Sample G23 has a BaO content of more than about 25% by weight; hence, Capacitor Sample 20 prepared using Glass Sample G23 exhibits a low Qf value.

Glass Sample G26 has a CaO content of more than about 15% by weight; hence, Capacitor Sample 23 prepared using Glass Sample G26 has low chemical stability and insulation reliability.

Glass Sample G28 has a SrO content of more than about 25% by weight; hence, Capacitor Sample 25 prepared using Glass Sample G28 exhibits a low Qf value.

Composition Sample 28 contains less than about 3% by weight of the borosilicate glass particles prepared using Glass Sample G15; hence, Composition Sample 28 is not sintered at about 1,000° C. or less and Capacitor Sample 28 cannot be prepared using Composition Sample 28 as shown in Table 3.

Composition Samples 12 and 29 to 45 contain the borosilicate glass particles prepared using Glass Sample G15. Capacitor Samples 12 and 29 to 45 prepared using Composition Samples 12 and 29 to 45, respectively, will now be compared to each other on the basis of the content of a component in the second ceramic particles.

Capacitor Sample 45 prepared using Composition Sample 45 containing more than about 18% by weight $CaTiO_3$, which is a component of the second ceramic particles, has a Qf value less than those of Capacitor Samples 30, 32, 39, 40, and 44 prepared using Composition Samples 30, 32, 39, 40, and 44, respectively, containing 18% by weight or less $CaTiO_3$ and has a dielectric constant greater than those of Capacitor Samples 30, 32, 39, 40, and 44. Therefore, the content of $CaTiO_3$ in each composition sample is preferably about 18% by weight or less.

Capacitor Sample 43 prepared using Composition Sample 43 containing more than about 13% by weight $SrTiO_3$, which is a component of the second ceramic particles, has a Qf value less than those of Capacitor Samples 12, 31, and 33 to 38 prepared using Composition Samples 12, 31, and 33 to 38, respectively, containing about 13% by weight or less $SrTiO_3$ and has a dielectric constant greater than those of Capacitor Samples 12, 31, and 33 to 38. Therefore, the content of $SrTiO_3$ in each composition sample is preferably about 13% by weight or less.

Capacitor Sample 41 prepared using Composition Sample 41 containing more than about 30% by weight $TiO_2$, which is a component of the second ceramic particles, has a dielectric constant greater than those of Capacitor Samples 29 and 32 to 42 prepared using Composition Samples 29 and 32 to 42, respectively, containing about 30% by weight or less $TiO_2$. Therefore, the content of $TiO_2$ in each composition sample is preferably about 30% by weight or less.

The following capacitor samples have a temperature coefficient of resonant frequency of −10 to 10 ppm/° C. and a high Qf value: Capacitor Samples 32, 39, and 40 prepared using Composition Samples 32, 39, and 40, respectively, containing about 8% to 12% by weight $CaTiO_3$ and about 0.3% to 3% by weight $TiO_2$.

The following capacitor samples have a temperature coefficient of resonant frequency of about −10 to 10 ppm/° C. and a high Qf value: Capacitor Samples 33, 34, and 38 prepared using Composition Samples 33, 34, and 38, respectively, containing about 6% to 10% by weight $SrTiO_3$ and about 0.3% to 3% by weight $TiO_2$. In contrast, the following capacitor samples have a temperature coefficient of resonant frequency with an absolute value of greater than about 10 ppm/° C.: Capacitor Sample 35 prepared using Composition Sample 35 containing about 5% by weight $SrTiO_3$, Capacitor Sample 36 prepared using Composition Sample 36 containing about 5.5% by weight $TiO_2$, and Capacitor Sample 37 prepared using Composition Sample 37 containing about 0.1% by weight $TiO_2$, these composition samples being outside the scope of the present invention.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A glass-ceramic composition comprising:
   first ceramic particles comprising forsterite;
   second ceramic particles comprising at least one member selected from the group consisting of calcium titanate, strontium titanate, and titanium oxide; and
   at least about 3% borosilicate glass particles containing about 3% to 15% lithium oxide, about 20% to 50% magnesium oxide, about 15% to 30% boron oxide, about 10% to 45% silicon oxide, about 6% to 20% zinc oxide, 0% to about 15% aluminum oxide, and at least about 2% of at least one additive selected from the group consisting of calcium oxide, barium oxide, and strontium oxide, wherein the upper limit of the additive content is 15%, 25%, or 25% when the additive is calcium oxide, barium oxide, or strontium oxide, respectively, and wherein all percentages are by weight.

2. The glass-ceramic composition according to claim 1, wherein the content of the first ceramic particles is at least about 55%, that of the second ceramic particles is about 6% to 30%, and that of the borosilicate glass particles is about 3% to 20%.

3. The glass-ceramic composition according to claim 2, wherein when present the content of calcium titanate in the glass-ceramic composition is about 18% or less, the content of strontium titanate in the glass-ceramic composition is about 13% or less, and the content of titanium oxide in the glass-ceramic composition is about 0.3% to 30%.

4. The glass-ceramic composition according to claim 3, wherein the borosilicate glass comprises about 4% to 10% lithium oxide, about 30% to 45% magnesium oxide, about 15% to 25% boron oxide, about 15% to 30% silicon oxide, about 6% to 20% zinc oxide, 0% to about 10% aluminum oxide.

5. The glass-ceramic composition according to claim 4, wherein the borosilicate glass is about 3% to 15%.

6. The glass-ceramic composition according to claim 5, wherein the first ceramic particles have a MgO to $SiO_2$ molar ratio between about 1.92 and 2.04, a content of impurities of about 5% by weight or less, and a median diameter of about 1 μm or less.

7. The glass-ceramic composition according to claim 2, wherein the second ceramic particles comprise about 8% to 12% strontium oxide and about 0.3% to 3% titanium oxide.

8. The glass-ceramic composition according to claim 2, wherein the second ceramic particles comprise about 6% to 10% strontium titanate and about 0.3% to 3% titanium oxide on a weight basis.

9. The glass-ceramic composition according to claim 1, wherein the borosilicate glass comprises about 4% to 10% lithium oxide, about 30% to 45% magnesium oxide, about 15% to 25% boron oxide, about 15% to 30% silicon oxide, about 6% to 20% zinc oxide, 0% to about 10% aluminum oxide.

10. The glass-ceramic composition according to claim 1, wherein the borosilicate glass is about 3% to 15%.

11. The glass-ceramic composition according to claim 1, wherein the first ceramic particles have a MgO to $SiO_2$ molar ratio between about 1.92 and 2.04, a content of impurities of about 5% by weight or less, and a median diameter of about 1 μm or less.

12. A glass-ceramic sintered body prepared by firing a green body made of a glass-ceramic composition comprising first ceramic particles comprising forsterite; second ceramic particles comprising at least one member selected from the group consisting of calcium titanate, strontium titanate, and titanium oxide; and at least about 3% of borosilicate glass particles containing about 3% to 15% lithium oxide, about 20% to 50% magnesium oxide, about 15% to 30% boron oxide, about 10% to 45% silicon oxide, about 6% to 20% zinc oxide, 0% to about 15% aluminum oxide, and at least about 2% of at least one additive selected from the group consisting of calcium oxide, barium oxide, and strontium oxide, the upper limit of the additive content being about 15%, about 25%, and about 25% when the additive is calcium oxide, barium oxide, or strontium oxide, respectively, on a weight basis, wherein the fired body contains crystal grains of which $Mg_2SiO_4$ grains are the principal crystal grains and $Li_2(Mg, Zn)SiO_4$ grains are minor crystal grains.

13. A glass-ceramic sintered body containing crystal grains of which $Mg_2SiO_4$ grains are the principal crystal grains and $Li_2(Mg, Zn)SiO_4$ grains are minor crystal grains.

14. The glass-ceramic composition according to claim 1, wherein when present the content of calcium titanate in the glass-ceramic composition is about 18% or less, the content of strontium titanate in the glass-ceramic composition is about 13% or less, and the content of titanium oxide in the glass-ceramic composition is about 0.3% to 30%.

15. The glass-ceramic composition according to claim 14, wherein the second ceramic particles comprise about 8% to 12% strontium oxide and about 0.3% to 3% titanium oxide.

16. The glass-ceramic composition according to claim 14, wherein the second ceramic particles comprise about 6% to 10% strontium titanate and about 0.3% to 3% titanium oxide on a weight basis.

17. The glass-ceramic composition according to claim 3, wherein the borosilicate glass comprises about 4% to 10% lithium oxide, about 30% to 45% magnesium oxide, about 15% to 25% boron oxide, about 10% to 30% silicon oxide, about 6% to 20% zinc oxide, 0% to about 10% aluminum oxide.

18. The glass-ceramic sintered body according to claim 12 prepared by firing said green body when it is disposed in a predetermined shape.

19. The glass-ceramic sintered body according to claim 10, wherein the first ceramic powder has a mean particle size of about 1 μm or less; and when present, the strontium titanate has a specific surface area of about 1.5-7.5 $m^2/g$.

* * * * *